United States Patent [19]

Adachi

[11] Patent Number: 5,043,792

[45] Date of Patent: Aug. 27, 1991

[54] INTEGRATED CIRCUIT HAVING WIRING STRIPS FOR PROPAGATING IN-PHASE SIGNALS

[75] Inventor: Takao Adachi, Tokyo, Japan

[73] Assignee: NEC Corporation, Tokyo, Japan

[21] Appl. No.: 508,853

[22] Filed: Apr. 12, 1990

[30] Foreign Application Priority Data

Apr. 17, 1989 [JP] Japan .................................. 1-97946

[51] Int. Cl.[5] ...................... H01L 29/52; H01L 23/48; H01P 3/08
[52] U.S. Cl. ........................................ 357/71; 357/68; 333/238; 307/303.1
[58] Field of Search .................... 357/68, 71; 333/238; 307/303.1

[56] References Cited

U.S. PATENT DOCUMENTS 4,626,889 12/1986 Yamamoto et al. .................. 357/68
4,924,293 5/1990 Saito et al. ............................ 357/68

Primary Examiner—Jerome Jackson, Jr.
Attorney, Agent, or Firm—Helfgott & Karas

[57] ABSTRACT

An integrated circuit is fabricated on a semiconductor substrate and comprises a plurality of component circuits having first and second circuits respectively serving as signal sources and a third circuit serving as a signal destination, an insulating film covering a major surface of the semiconductor substrate, and a plurality of wiring strips formed in the insulating film and having a first wiring strip interconnecting the first circuit and the third circuit and a second wiring strip coupled to the second circuit, in which the first and second wiring strips are arranged to be opposed to one another through the insulating film and in which the first and second wiring strips respectively propagate signals substantially in phase with one another, so that a parasitic capacitance between the first and second wiring strips are drastically decreased, thereby causing the signal propagations to be improved in speed.

8 Claims, 7 Drawing Sheets

INTEGRATED CIRCUIT HAVING WIRING STRIPS FOR PROPAGATING IN-PHASE SIGNALS

FIELD OF THE INVENTION

This invention relates to an integrated circuit fabricated on a semiconductor substrate and, more particularly, to an arrangement of wiring strips incorporated in the integrated circuit for propagating signals in phase or in-phase signals.

DESCRIPTION OF THE RELATED ART

An integrated circuit is fabricated on a semiconductor substrate, and wiring strips interconnect component circuits for propagating signals from signal sources to destinations. FIG. 1 shows an example of the integrated circuit fabricated on a semiconductor substrate 1, and the integrated circuit has a component circuit 2 serving as a signal source and component circuits 3 and 4 serving as destinations. Although other signal sources and destinations are provided on the semiconductor substrate and other wiring strips interconnect the signal sources and associated destinations, respectively, those are not shown in FIG. 1. The signal source 2 is coupled to the destinations 3 and 4 through a wiring strip 5, and the wiring strip 5 is bifurcated into two branches 5a and 5b so that a signal produced by the signal source 2 is propagated through the wiring strip 5 to both of the destinations 3 and 4. FIG. 2 is a circuit diagram equivalent to the circuit arrangement shown in FIG. 1, and parasitic capacitances C1 and C2 are coupled to the wiring strip 5 as shown in FIG. 3, because an insulating film (not shown) is provided between the wiring strip 5 and the substrate 1. The wiring strip 5 has side surfaces 5c and 5d and a bottom surface 5e, and the parasitic capacitance C1 is produced between the bottom surface 5e and the substrate 1, but the parasitic capacitance C2 is coupled to the side surfaces 5c and 5d of the wiring strip 5. When taking the parasitic capacitances C1 and C2 into account, the equivalent circuit is modified as shown in FIG. 4. In FIG. 4, R and Cd are indicative of an internal resistance of the signal source 2 and a parasitic capacitance coupled to the output node of the signal source 2, respectively, and Cg stands for a parasitic capacitance coupled to the input node of each destination 3 or 4.

The time constant $\tau$ of the integrated circuit shown in FIG. 1 is, then, calculated as $$\tau = R(Cd + C1 + 2C2 + 2Cg) \quad \text{(Equation 1)}$$

When the distributive law is applied to Equation 1, we obtain $$\tau = R \times Cd + R(C1 + 2C2) + 2RCg \quad \text{(Equation 2)}$$

Equation 2 teaches us that the time constant is increased with length of the wiring strip 5, and, accordingly, a substantial amount of time delay tends to be introduced in the signal propagation along the wiring strip 5.

Of course, reduction of the internal resistance R results in a small time constant and, accordingly, a high speed signal propagation. However, there is a trade-off between the internal resistance R and the parasitic capacitance Cd. Namely, the internal resistance R is dependent on channel resistances of MOS field effect transistors of an output buffer circuit, and the MOS field effect transistor with a wide channel decreases the internal resistance R but increases the parasitic capacitance Cd due to a large amount of the gate area. Moreover, it is necessary to enlarge the output transistors of the previous stage, because a small current driving capability of the previous stage is causative of undesirable current passing through a series combination of output transistors or the output buffer circuit. The enlarged output transistors of the previous stage further request an output buffer circuit with a large current driving capability provided upstream thereof, and a sequence of such enlarged output transistors consume a large amount of real estate on the semiconductor substrate 1. Thus, the approach to decreasing the internal resistance R is not effective against prolonged signal propagation, and, therefore, another approach is requested.

SUMMARY OF THE INVENTION

It is therefore an important object of the present invention to provide a semiconductor device which has a signal line improved in signal propagation speed. To accomplish the object, the present invention proposes to accompany a signal line with another signal line propagating an in-phase signal.

In accordance with the present invention, there is provided an integrated circuit fabricated on a semiconductor substrate, comprising: a) a plurality of component circuits having first and second circuits respectively serving as signal sources and a third circuit serving as a signal destination; b) an insulating film covering a major surface of the semiconductor substrate; and c) a plurality of wiring strips formed in the insulating film and having a first wiring strip interconnecting the first circuit and at least the third circuit and a second wiring strip coupled to the second circuit, in which the first and second wiring strips are arranged to be opposed to one another through the insulating film and in which the first and second wiring strips respectively propagate signals substantially in phase with one another.

BRIEF DESCRIPTION OF THE DRAWINGS

The features and advantages of a semiconductor device according to the present invention will be more clearly understood from the following description taken in conjunction with the accompanying drawings in which.

DESCRIPTION OF THE PREFERRED EMBODIMENTS

First Embodiment

Figure 1:
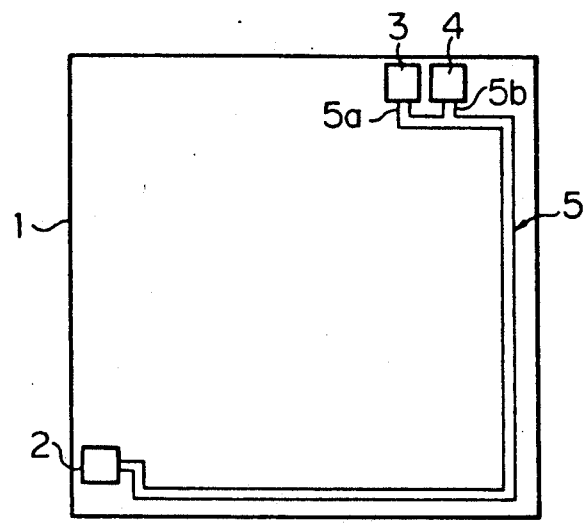
FIG. 1 is a plan view showing a part of the layout of a prior art integrated circuit fabricated on a semiconductor substrate.
Figure 2:
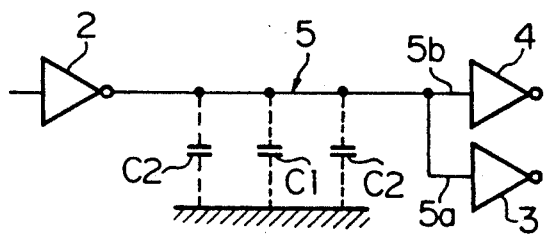
FIG. 2 is a circuit diagram equivalent to the integrated circuit shown in FIG. 1.
Figure 3:
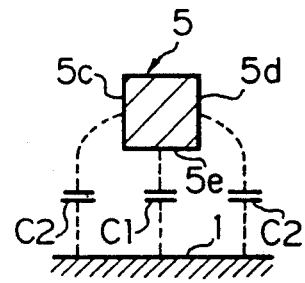
FIG. 3 is a cross sectional view showing, a modeled form, parasitic capacitances coupled to a wiring strip incorporated in the integrated circuit shown in FIG. 1.
Figure 4:
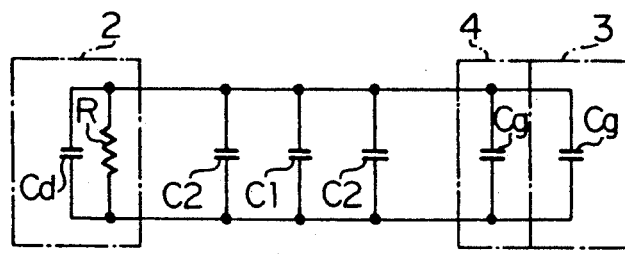
FIG. 4 is a circuit diagram showing the integrated circuit shown in FIG. 1 together with the parasitic capacitances coupled to the wiring strip.
Figure 5:
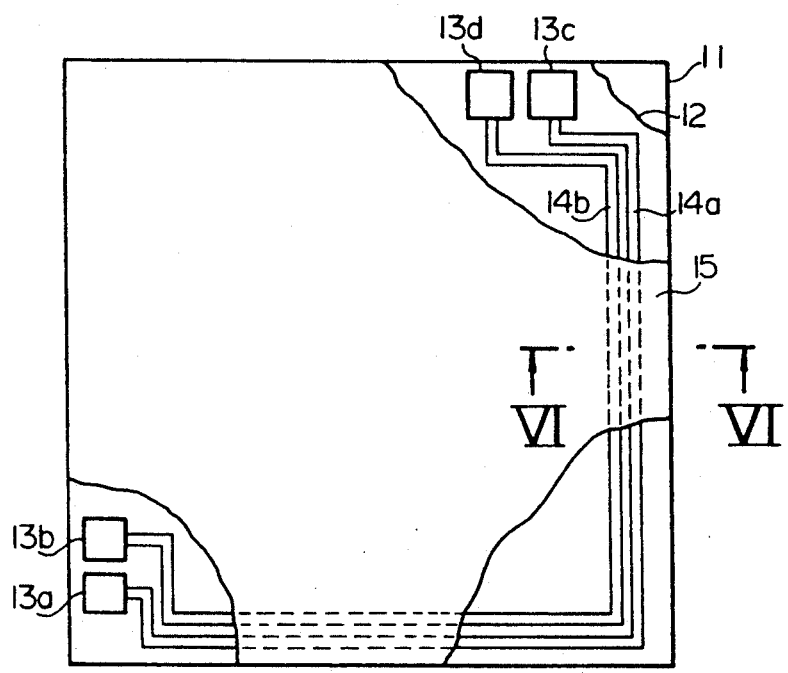
FIG. 5 is a plan view showing a part of the layout of an integrated circuit according to the present invention.
Figure 6:
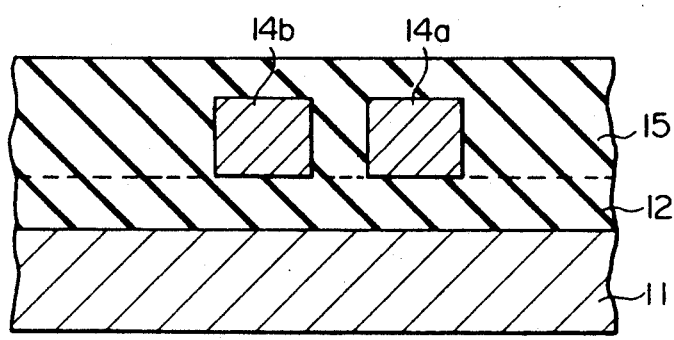
FIG. 6 is a cross sectional view taken along line VI—VI of FIG. 5 and showing wiring strips incorporated in the integrated circuit.

Referring first to FIGS. 5 and 6 of the drawings, an integrated circuit embodying the present invention is fabricated on a semiconductor substrate 11 covered with a lower insulating film 12. A large number of component circuits are incorporated in the integrated circuit, and first, second, third and fourth circuits 13a, 13b, 13c and 13d are included in the component circuits. The first and second circuits 13a and 13b produces respective signals substantially in phase with one another (which are hereinbelow referred to as "in-phase signals"), so that the first and second circuits 13a and 13b serve as signal sources, respectively. The first and second circuits 13a and 13b are coupled through first and second wiring strips 14a and 14b to the third and fourth circuits 13c and 13d, respectively, and the first and second wiring strips 14a and 14b respectively propagate the in-phase signals to the third and fourth circuits 13c and 13d. Then, the third and fourth circuits 13c and 13d serve as signal destinations, respectively.

Figure 7:
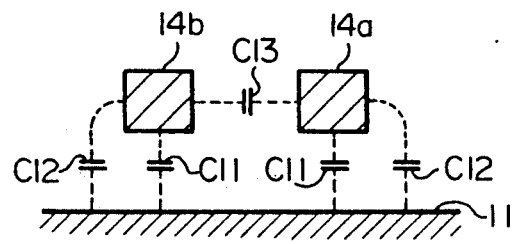
FIG. 7 is a cross sectional view showing the wiring strips incorporated in the integrated circuit shown in FIG. 5.
Figure 8:
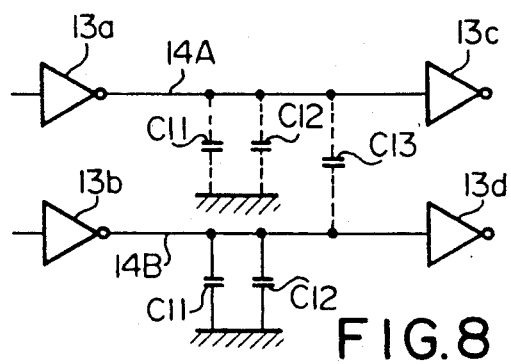
FIG. 8 is a circuit diagram equivalent to the integrated circuit shown in FIG. 5.

The first and second wiring strips 14a and 14b are covered with an upper insulating film 15, and, therefore, the first and second wiring strips 14a and 14b are opposed through the insulating film 12 to the semiconductor substrate 11 and further through the insulating film 15 to one another as will be better seen from FIG. 6. The first and second wiring strips 14a and 14b thus arranged are causative of parasitic capacitances C11, C12 and C13, and the parasitic capacitances C11 and C12 are coupled between the bottom surfaces of the wiring strips 14a and 14b and the semiconductor substrate 11 and between the side surfaces thereof and the semiconductor substrate 11, respectively, but the parasitic capacitance C13 takes place between the side surface of the first wiring strip 14a and the side surface of the second wiring strip 14b as illustrated in FIG. 7. As a result, the first and second wiring strips 14a and 14b are equivalent to a circuit diagram shown in FIG. 8. Since each of the first and second circuits 13a and 13b has an internal resistance R and a parasitic capacitance coupled to the output node thereof and each of the third and fourth circuits 13c and 13d has a parasitic capacitance Cg coupled to an input node thereof, an equivalent circuit shown in FIG. 9 stands for the first to fourth circuits 13a to 13d associated with the first and second wiring strips 14a and 14b.

Figure 9:
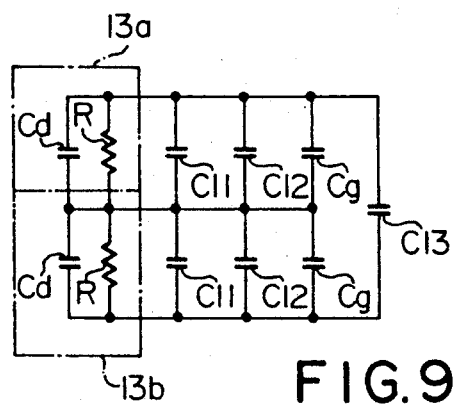
FIG. 9 is a circuit diagram showing the integrated circuit shown in FIG. 5 together with parasitic capacitances.

If the first and second wiring strips 14a and 14b respectively propagate the in-phase signals, the parasitic capacitance C13 is eliminated from the equivalent circuit shown in FIG. 9, and the time constant $\tau$ of each wiring strip 14a or 14b is given by the following equation $$\tau = R(Cd + C11 + C12 + Cg) \quad \text{(Equation 3)}$$

The parasitic capacitance C13 accounts for a substantial part of the parasitic capacitance coupled to the right side surface of the wiring strip 14a; however, the parasitic capacitance C13 is eliminated from the parasitic capacitance coupled to the right side surface of the wiring strip 14A according to the present invention, and, for this reason, the total amount of the parasitic capacitances and, accordingly, the time constant $\tau$ is drastically decreased due to the in-phase signals on the first and second wiring strips 14a and 14b. Moreover, the prior art wiring strip 5 is bifurcated into two parts for the two signal destinations, and, therefore, the parasitic capacitances 2Cg is coupled to the wiring strip 5. However, since each of the wiring strips 14a and 14b is coupled to only one signal destination, the parasitic capacitance due to the signal destination and, accordingly, the time constant are further decreased to respective small values. Comparing Equation 3 with Equation 1, it will be understood that the parasitic capacitance coupled to the first wiring strip 14a is smaller than that coupled to the wiring strip 5 by (C2+Cg).

This approach is effective in application to an ultra large scale integration. In detail, each wiring strip is decreased in width with minimum device dimensions but is hardly decreased in thickness, and the parasitic capacitance coupled to the side surfaces accounts for a large percentage of the total parasitic capacitance coupled to the wiring strip. Applicant's approach aims at reduction in parasitic capacitance coupled to the side surfaces of the wiring strip, and is, therefore, effective against the signal delay.

Second Embodiment

Figure 10:
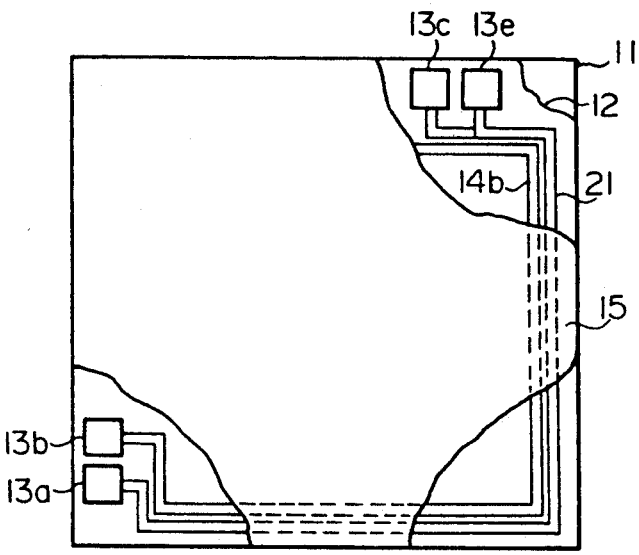
FIG. 10 is a plan view showing a part of the layout of another integrated circuit according to the present invention.
Figure 11:
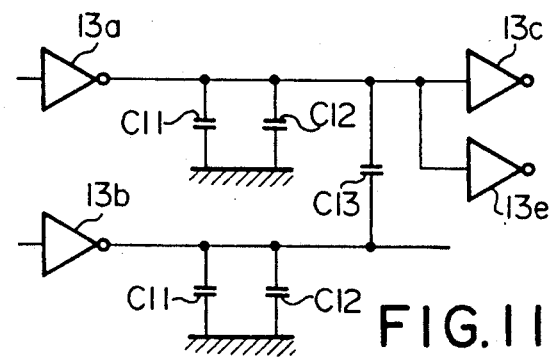
FIG. 11 is a circuit diagram equivalent to the integrated circuit shown in FIG. 10.
Figure 12:
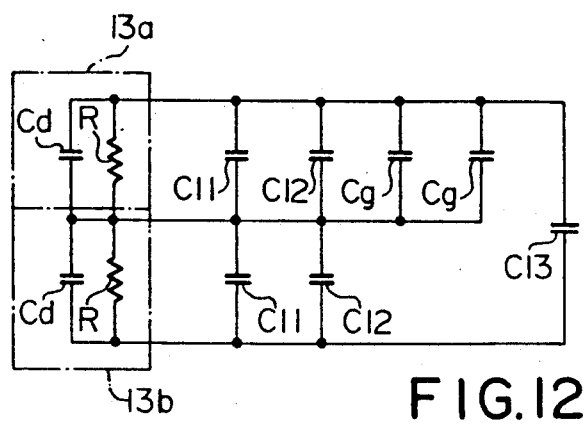
FIG. 12 is a circuit diagram showing the integrated circuit shown in FIG. 10 together with parasitic capacitances.

Turning to FIGS. 10 to 12 of the drawings, another integrated circuit embodying the present invention is illustrated. The integrated circuit shown in FIGS. 10 to 12 is similar to that shown in FIG. 5 with the exception of a bifurcated first wiring strip 21 and of elimination of the fourth circuit 13d, and, for this reason, the other circuit components are designated by the same reference numerals used in the first embodiment without any detailed description. The component circuits further includes a fifth circuit 13e serving as a signal destination, and the bifurcated first wiring strip 21 is coupled to not only the third circuit 13c but also the fifth circuit 13e. Parasitic capacitances C11, C12 and C13 are coupled to the integrated circuit as shown in FIG. 11, and the integrated circuit thus arranged is equivalent to a diagram shown in FIG. 12.

In this instance, the time constant $\tau$ is given as follows:

$$\tau = R[C_s + 2C_g(1+(C_{13}/C_s))/(1+2(C_{13}/C_s))] \quad \text{(Equation 4)}$$

where Cs is the total capacitance of Cd, C11 and C12. In this arrangement, influences of the parasitic capacitance C13 is hardly decreased to zero, but is quite negligible because of the in-phase signals.

The bifurcated second wiring strip 21 is effective against the parasitic capacitance rather than wiring strips vertically spaced from each other.

Third Embodiment

Figure 13:
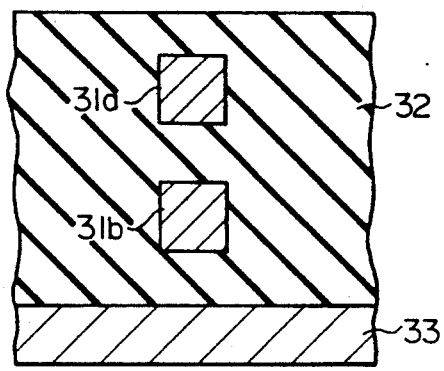
FIG. 13 is a cross sectional view showing wiring strips incorporated in still an integrated circuit according to the present invention.
Figure 14:
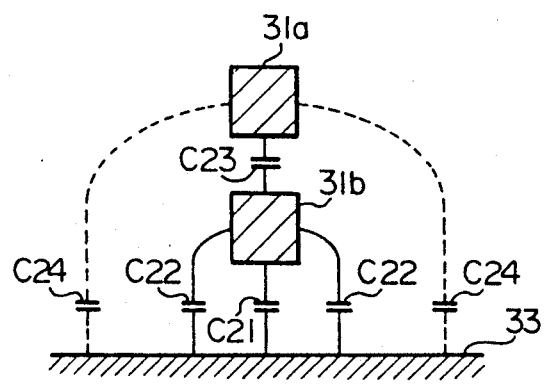
FIG. 14 is a cross sectional view showing parasitic capacitances coupled to the wiring strips shown in FIG. 13.
Figure 15:
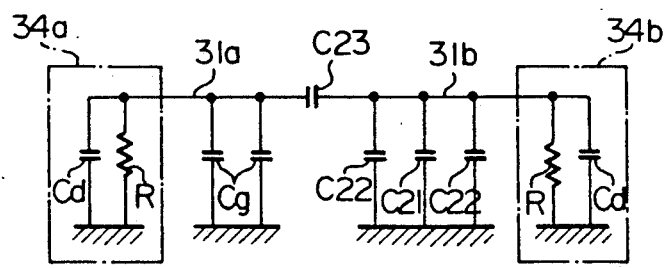
FIG. 15 is a circuit diagram showing the integrated circuit equipped with the wiring strips shown in FIG. 13 together with the parasitic capacitances.

Turning to FIGS. 13 to 15, still another integrated circuit embodying the present invention has first and second wiring strips 31a and 31b vertically spaced apart from each other and formed in an insulating film 32 on the major surface of a semiconductor substrate 33. The first and second wiring strips 31a and 32b are respectively coupled to first and second circuits 34a and 34b, and the first wiring strip 31a is further coupled at the other end thereof to third and fifth circuits represented by respective parasitic capacitances Cg coupled to the input nodes thereof. The second wiring strip 31b is accompanied with three parasitic capacitances namely C21 between the bottom surface and the semiconductor substrate 33, C22 between the side surfaces and the semiconductor substrate 33 and C23 between the upper surface and the first wiring strip 31a. A parasitic capacitance C24 is produced between the side surfaces of the first wiring strip 31a and the semiconductor substrate 33. The parasitic capacitance C24 is much smaller than the parasitic capacitance C22, and, for this reason, is ignored in FIG. 15. The time constant $\tau$ is calculated as $$\tau = R(C_aC_b + C_bC_c + C_cC_a)/(C_b + 2C_c) \quad \text{(Equation 5)}$$

where Ca is the total capacitance of Cs and 2Cg, Cb is the total capacitance of C21 and 2C22, and Cc is equal to C23.

The time constant is also decreased because of the in-phase signals, and the wiring arrangement shown in FIG. 13 occupies a relatively small amount of real estate rather than the first and second embodiments.

Application to Semiconductor Memory Device

Figure 16:
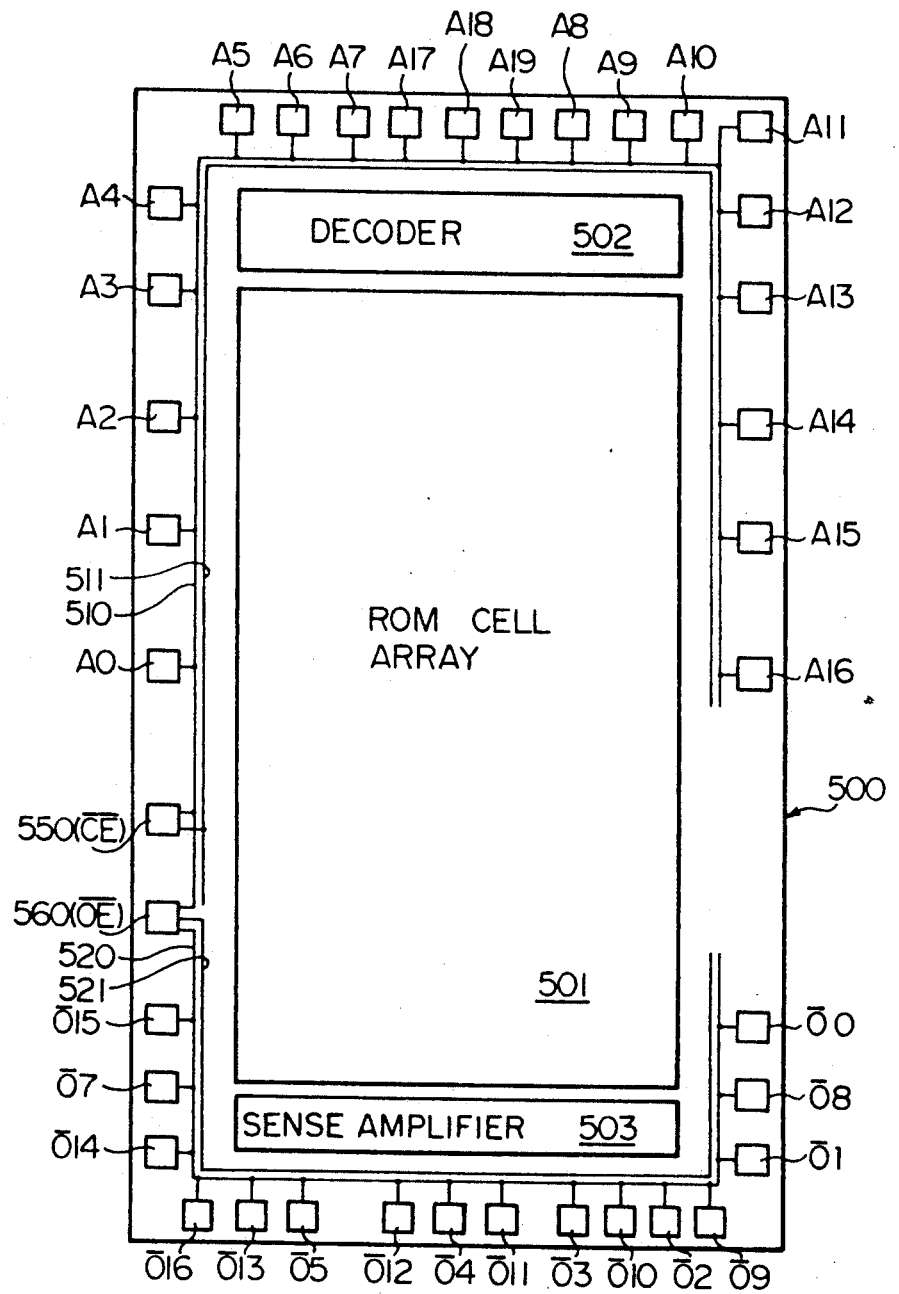
FIG. 16 is a plan view showing the layout of a read only memory device as an example of actual integrated circuit having the wiring strips according to the present invention.
Figure 17:
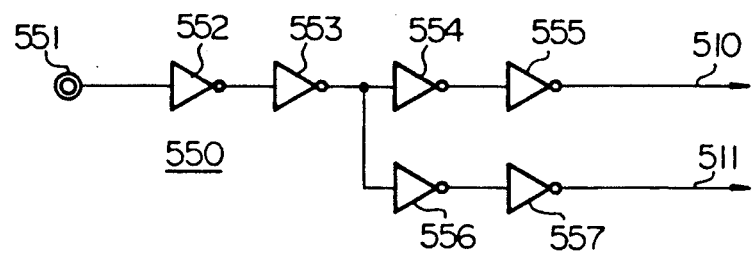
FIG. 17 is a circuit diagram showing a chip enable buffer circuit incorporated in the read only memory device shown in FIG. 16.
Figure 18:
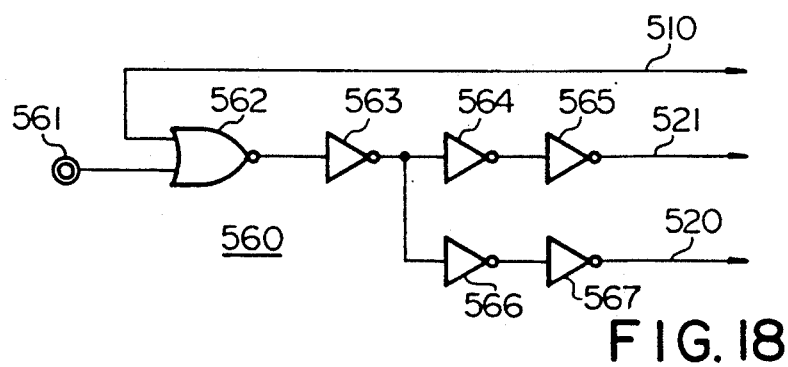
FIG. 18 is a circuit diagram showing an output enable buffer circuit incorporated in the read only memory device shown in FIG. 16.

The wiring arrangement according to the present invention is applicable to various integrated circuits. A read only memory device shown in FIGS. 16 to 18 is, by way of example, provided with the wiring arrangement according to the present invention.

The read only memory device is designated in its entirety by reference numeral 500, A 17-bit address signal is supplied to address input buffers A0 to A16, and the address input buffers A0 to A16 produce the complementary signal thereof and supply the address signal and the complementary signal to a decoder 502. The decoder 502 is responsive to the address signal and the complementary signal thereof, and selects ROM cells from a ROM cell array 501. In this instance, sixteen ROM cells are simultaneously accessed with a single address signal representative of address information. Data bits thus read out from the ROM cells are transferred to a sense amplifier unit 503, and the sense amplifier unit 503 increases differences in the voltage level through difference amplification so that a logic level of each data bit is rapidly determined by the sense amplifier unit 503. The data bits thus decided are supplied from output buffers O0 to O15 to an external device. Signal lines interconnecting the address input buffers A0 to A16, the decoder 502, the ROM cell array 501, the sense amplifier unit 503 and the output buffers O0 to O15 are eliminated from FIG. 13 for the sake of simplicity.

The read only memory device 500 further has a chip enable buffer 550 ($\overline{CE}$) and an output enable buffer 560 ($\overline{OE}$), and a chip enable signal and an output enable signal are fed to these buffers 550 and 560, respectively. The chip enable signal allows the read only memory device 500 to enter an enable state, so that the read only memory device 500 fetches the address signal and sequentially activates the internal component circuits. For this purpose, the chip enable buffer 550 is coupled through a signal line 510 to the address input buffers A0 to A16. Since the address input buffers are provided along the periphery of the semiconductor chip, the signal line 510 is extremely long. Then, one more signal line 511 is provided in parallel to the signal line 510, and the chip enable buffer 550 produces a signal in phase with the chip enable signal. The chip enable signal and the in-phase signal are respectively supplied to the signal lines 510 and 511. Thus, the signal line 511 propagates the in-phase signal, and, for this reason, the time constant related to the signal line 510 is drastically decreased as described hereinbefore, which results in improvement of signal propagating speed of the signal line 510. In detail, FIG. 17 shows the circuit arrangement of the chip enable buffer 550, and the chip enable signal is supplied from the outside thereof to a node 551. The chip enable signal is transferred through four inverter circuits 552 to 555 to the signal line 510, and an intermediate node between the inverter circuits 553 and 554 transfers the chip enable signal through the inverter circuits 556 and 557 to the signal line 511. Since the chip enable signal is thus branched from the intermediate node but is transferred to the signal lines 510 and 511 via inverter circuits equal in number to each other, the signals on the signal lines 510 and 511 are in phase with each other. In this application, the chip enable buffer 550 includes first and second circuits (each implemented by a series combination of the inverter circuits 552 to 555 or 552, 553, 556 and 557) for producing the in-phase signals, and the signal lines 510 and 511 serve as first and second wiring strips.

The present invention further appertains to another component circuit of the read only memory device 500. In detail, the output buffer 560 is supplied with the output enable signal, and the output enable signal controls the read-out timing for the data bits read out from the ROM cells under the enable state of the read only memory device 500. Then, the chip enable signal on the signal line 510 is fed to the output enable buffer 560, and the output enable buffer 560 relays the output enable signal to the output buffers O0 to O15 in the presence of the chip enable signal. The output buffers O0 to O15 are also provided along the periphery of the semiconductor chip, and, for this reason, a signal line for the output enable signal is extremely long. In accordance with the present invention, the signal line 520 is associated with another signal line 521, and in-phase signals are supplied to the signal lines 520 and 521, respectively. As shown in FIG. 18, the output enable signal is fed to a node 561, and the output enable signal and the chip enable signal are supplied in parallel to a NOR gate 562. Since the NOR gate 562 is activated in the presence of the chip enable signal on the signal line 510, the output enable signal is transferred from the node 561 to an inverter circuit 563 in the presence of the chip enable signal on the signal line 510. The output enable signal is further transferred through inverter circuits 564 and 565 to the signal line 521 and through inverter circuits 566 and 567 to the signal line 520. Then, the output signals on the signal lines 520 and 521 are in phase with each other. In this instance, the inverter circuits 563, 566 and 567 form in combination a first circuit coupled to a first wiring strip, and the inverter circuits 563 to 565 as a whole constitute a second circuit coupled to a second wiring strip.

The signal line 510 for the chip enable signal and the signal line 520 for the output enable signal are extremely long, however, the signal lines 511 and 521 are provided in association with the signal lines 510 and 520, respectively, and the in-phase signals are respectively supplied to the associated signal lines 511 and 521 according to the present invention, so that the parasitic capacitances respectively coupled to the signal lines 510 and 520 are drastically decreased and, accordingly, high-speed signal propagations are achieved in the read only memory device 500.

Although particular embodiments of the present invention have been shown and described, it will be obvious to those skilled in the art that various changes and modifications may be made without departing from the spirit and scope of the present invention.

What is claimed is:

1. An integrated circuit fabricated on a semiconductor substrate, comprising:
    a) a plurality of component circuits having first and second circuits respectively serving as signal sources and a third circuit serving as a signal destination;
    b) an insulating film covering a major surface of said semiconductor substrate; and
    c) a plurality of wiring strips formed in said insulating film and having a first wiring strip interconnecting said first circuit and at least said third circuit and a second wiring strip coupled to said second circuit, in which said first and second wiring strips are arranged in opposing relation with one another through said insulation film and so that said first and second wiring strips respectively propagate in-phase signals shifted between first and second voltage levels.

2. An integrated circuit as set forth in claim 1, in which said first and second wiring strips are laterally spaced apart from one another with respect to the major surface of said semiconductor substrate.

3. An integrated circuit as set forth in claim 2, in which said component circuits further includes a fourth circuit serving as a signal destination and coupled to said second wiring strip at the opposite end to said second circuit.

4. An integrated circuit as set forth in claim 2, in which said component circuits further includes a fifth circuit serving as a signal destination and coupled to said first wiring strip.

5. An integrated circuit as set forth in claim 1, in which said first and second wiring strips are vertically spaced apart from each other with respect to the major surface of said semiconductor substrate.

6. A semiconductor memory device fabricated on a semiconductor substrate covered with an insulating film, comprising:
    a) memory cell array having a plurality of memory cells respectively memorizing data bits;
    b) an addressing unit having a plurality of address input buffers coupled to a first chip enable line positioned in said insulating film, said first chip enable line being supplied with a chip enable signal which shifts a voltage thereof between first and second levels; and
    c) a data output facility having a plurality of output buffers coupled to a first output enable line positioned in said insulating film, said first output enable line being supplied with an output enable signal, and a second chip enable line extending in said insulating film in opposing relation with said first chip enable line so that said second chip enable line propagates an auxiliary chip enable signal in phase with said chip enable signal.

7. A semiconductor memory device as set forth in claim 6, in which said semiconductor memory device further comprises a second output enable line extending in said insulating film in an opposing relation with said second output enable line and propagating an auxiliary output enable signal in phase with said output enable signal.

8. A semiconductor memory device as set forth in claim 7, in which said semiconductor memory device is of the read only memory.

* * * * *